(12) United States Patent
Benschop et al.

(10) Patent No.: US 7,760,324 B2
(45) Date of Patent: Jul. 20, 2010

(54) LITHOGRAPHIC APPARATUS AND DEVICE MANUFACTURING METHOD

(75) Inventors: Jozef Petrus Henricus Benschop, Veldhoven (NL); Hans Butler, Best (NL); Nicolaas Rudolf Kemper, Eindhoven (NL); Bartholomeus Hendricus Koek, Eindhoven (NL); Frits Van Der Meulen, Eindhoven (NL); Harmen Klaas Van Der Schoot, Vught (NL)

(73) Assignee: ASML Netherlands B.V., Veldhoven (NL)

( * ) Notice: Subject to any disclaimer, the term of this patent is extended or adjusted under 35 U.S.C. 154(b) by 319 days.

(21) Appl. No.: 11/378,627

(22) Filed: Mar. 20, 2006

(65) Prior Publication Data

US 2007/0216882 A1   Sep. 20, 2007

(51) Int. Cl.
   *G03B 27/52* (2006.01)
(52) U.S. Cl. .......................................... 355/30; 355/53
(58) Field of Classification Search .................... 355/30, 355/53
   See application file for complete search history.

(56) References Cited

U.S. PATENT DOCUMENTS

| | | | |
|---|---|---|---|
| 4,509,852 A | 4/1985 | Tabarelli et al. | |
| 7,098,991 B2 * | 8/2006 | Nagasaka et al. | 355/53 |
| 7,286,205 B2 * | 10/2007 | Goodwin | 355/30 |
| 2004/0160582 A1 * | 8/2004 | Lof et al. | 355/30 |
| 2004/0263809 A1 * | 12/2004 | Nakano | 355/30 |
| 2005/0036121 A1 * | 2/2005 | Hoogendam et al. | 355/30 |
| 2006/0033894 A1 * | 2/2006 | Binnard | 355/30 |
| 2006/0082741 A1 * | 4/2006 | Van Der Toorn et al. | 355/30 |

FOREIGN PATENT DOCUMENTS

| | | |
|---|---|---|
| EP | 1 420 298 A2 | 5/2004 |
| EP | 1 420 300 A2 | 5/2004 |
| EP | 1 420 300 A3 | 8/2005 |
| EP | 1 420 298 A3 | 10/2005 |
| WO | 99/49504 | 9/1999 |
| WO | WO 2004090577 A2 * | 10/2004 |

* cited by examiner

*Primary Examiner*—Hung Henry Nguyen
*Assistant Examiner*—Steven H Whitesell-Gordon
(74) *Attorney, Agent, or Firm*—Pillsbury Winthrop Shaw Pittman LLP (57) ABSTRACT

An immersion lithographic projection apparatus includes a shutter member is employed to block a liquid supply system during substrate swap to ensure that liquid remains in contact with an element of the projection system during substrate swap. The shutter member is connected to a metrology frame which also supports the projection system. In this way the position of the shutter member is always known.

15 Claims, 6 Drawing Sheets

Fig. 14

LITHOGRAPHIC APPARATUS AND DEVICE MANUFACTURING METHOD

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see for example U.S. Pat. No. 4,509,852, hereby incorporated in its entirety by reference) means that there is a large body of liquid that is accelerated during a scanning exposure. This requires additional or more powerful motors and turbulence in the liquid may lead to undesirable and unpredictable effects.

Figure 2:
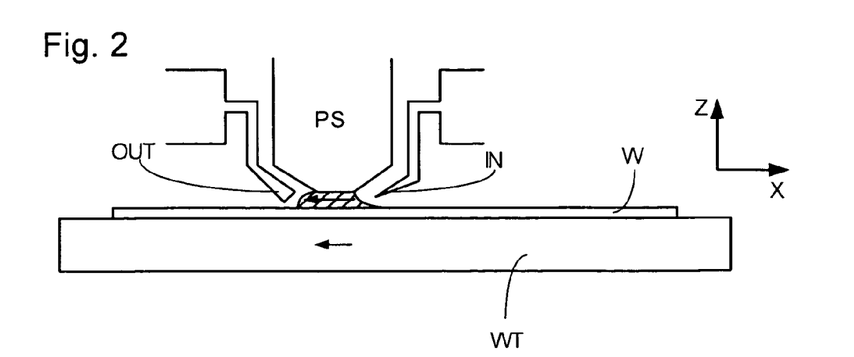
FIGS. 2 and 3 depict a liquid supply system used in a conventional lithographic projection apparatus.
Figure 3:
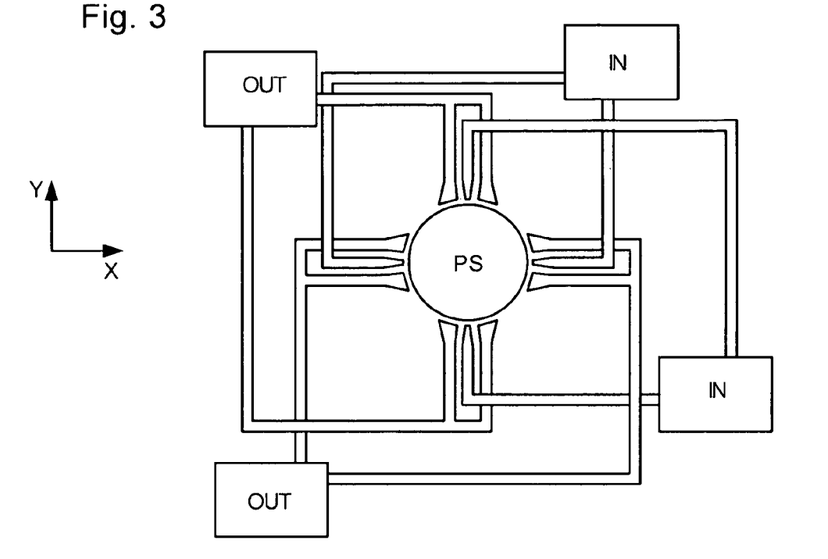

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

Figure 4:
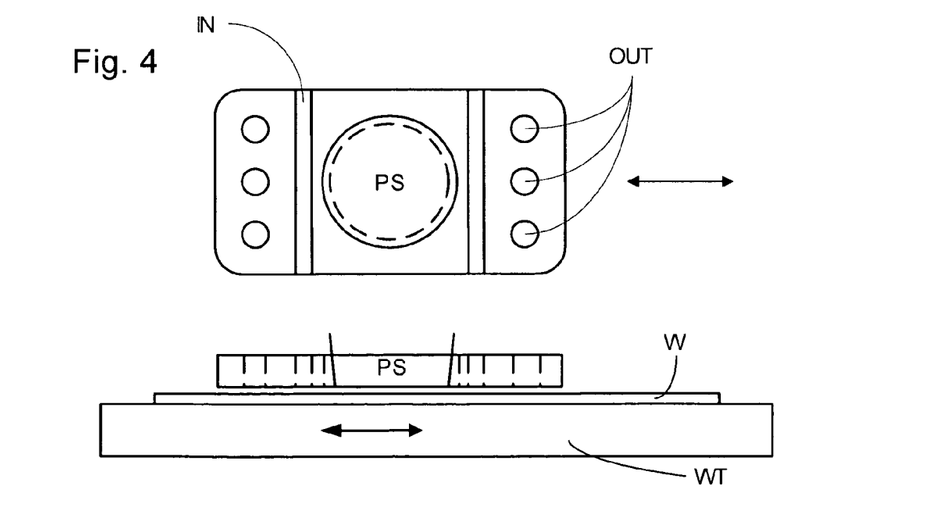
FIG. 4 depicts a liquid supply system used in a conventional lithographic projection apparatus.
Figure 5:
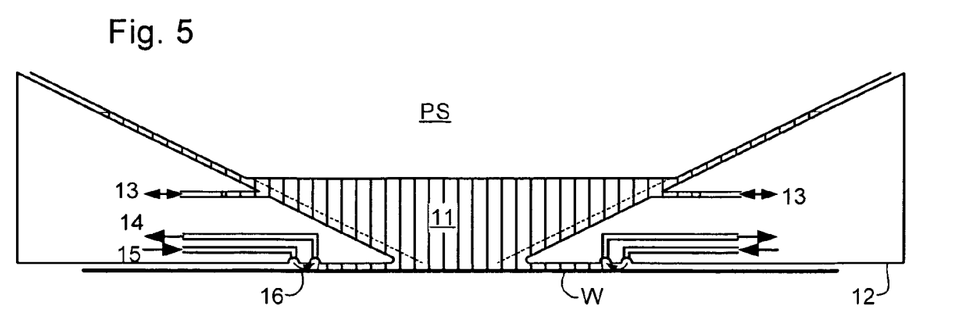
FIG. 5 depicts a further liquid supply system in accordance with an embodiment of the present invention.

Another solution which has been proposed is to provide the liquid supply system with a seal member which extends along at least a part of a boundary of the space between the final element of the projection system and the substrate table. Such a solution is illustrated in FIG. 4. The seal member is substantially stationary relative to the projection system in the XY plane though there may be some relative movement in the Z direction (in the direction of the optical axis). A seal is formed between the seal member and the surface of the substrate. Preferably the seal is a contactless seal such as a gas seal. Such a system with a gas seal is illustrated in FIG. 5 and is disclosed in EP-A-1,420,298.

In EP-A-1,420,300 hereby incorporated in its entirety by reference the idea of a twin or dual stage immersion lithography apparatus is disclosed. Such an apparatus is provided with two stages for supporting the substrate. Leveling measurements are carried out with a stage at a first position, without immersion liquid, and exposure is carried out with a stage at a second position, where immersion liquid is present. Alternatively, the apparatus has only one stage.

SUMMARY

It is desirable to provide a way in which it is possible to keep immersion liquid in contact with the final element of the projection system during substrate swap.

According to an embodiment of the invention, there is provided a lithographic projection apparatus arranged to project, using a projection system, a pattern from a patterning device through immersion liquid onto a substrate, the apparatus including: a liquid supply system configured to supply a space between a final element of the projection system and the substrate with the immersion liquid; a metrology frame to support the projection system and attached to but dynamically isolated from a base frame which supports the apparatus; a shutter member positionable substantially to ensure that liquid remains in contact with the final element when the substrate is moved away from under the projection system; and an actuator to position the shutter member and which is connected between the metrology frame and the shutter member.

According to an embodiment of the invention, there is provided a lithographic projection apparatus arranged to project a pattern from a patterning device through immersion liquid onto a substrate, the apparatus including: a liquid supply system configured to supply the immersion liquid; and a shutter member which has an extended state or configuration in which it is positionable to ensure that liquid remains in contact with the final element when the substrate is moved away from under the projection system and a retracted state or configuration in which the shutter member is rolled up.

According to an embodiment of the invention, there is provided a lithographic projection apparatus arranged to project, using a projection system, a pattern from a patterning device through immersion liquid onto a substrate, the apparatus including: a liquid supply system configured to supply to a space between a final element of the projection system and a substrate the immersion liquid; a shutter member positionable substantially to ensure that liquid remains in contact with the final element when the substrate is moved away from under the projection system; and a substrate table to support the substrate and including a drain area over which the liquid supply is positionable and at which position immersion liquid under the shutter member is removable.

According to an embodiment of the invention, there is provided a lithographic projection apparatus arranged to project, using a projection system, a pattern from a patterning device through immersion liquid onto a substrate, the apparatus including: a liquid supply system configured to supply the immersion liquid; first and second substrate tables, each for holding a substrate; an intermediate shutter member which is, in plan, smaller than an area to which immersion liquid is supplied by the liquid supply system and which is moveable in a plane parallel to the substrate; a controller to control swapping of one substrate for another under the projection system substantially without loosing immersion liquid from the liquid supply system by arranging for the substrate tables to move together under the liquid supply system with the intermediate surface member being positioned between the two substrate tables.

According to an embodiment of the invention, there is provided a device manufacturing method including using a projection system to project a patterned beam of radiation onto a substrate through immersion liquid provided between the projection system and the substrate by a liquid supply system, wherein, following the projecting a shutter member is inserted under the projection system before the substrate is removed such that immersion liquid remains in contact with a final element of the projection system when the substrate is removed, any liquid remaining under the shutter member being removed by a liquid removal device from the liquid supply system.

According to an embodiment of the invention, there is provided a device manufacturing method including using a projection system to project a patterned beam of radiation onto a substrate on a substrate table through immersion liquid provided between the projection system and the substrate by a liquid supply system, wherein, following the projecting a shutter member is inserted under the projection system before the substrate is removed such that immersion liquid remains in contact with a final element of the projection system when the substrate is removed, any liquid remaining under the shutter member being removed by a drain area on the substrate table over which the liquid supply system is positioned.

According to an embodiment of the invention, there is provided a device manufacturing method including using a projection system to project a patterned beam of radiation onto a substrate through immersion liquid provided between the projection system and the substrate by a liquid supply system, wherein, following the projecting, the liquid supply system is translated towards the projection system and a shutter member is inserted under the projection system before the substrate is removed such that immersion liquid remains in contact with a final element of the projection system when the substrate is removed.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
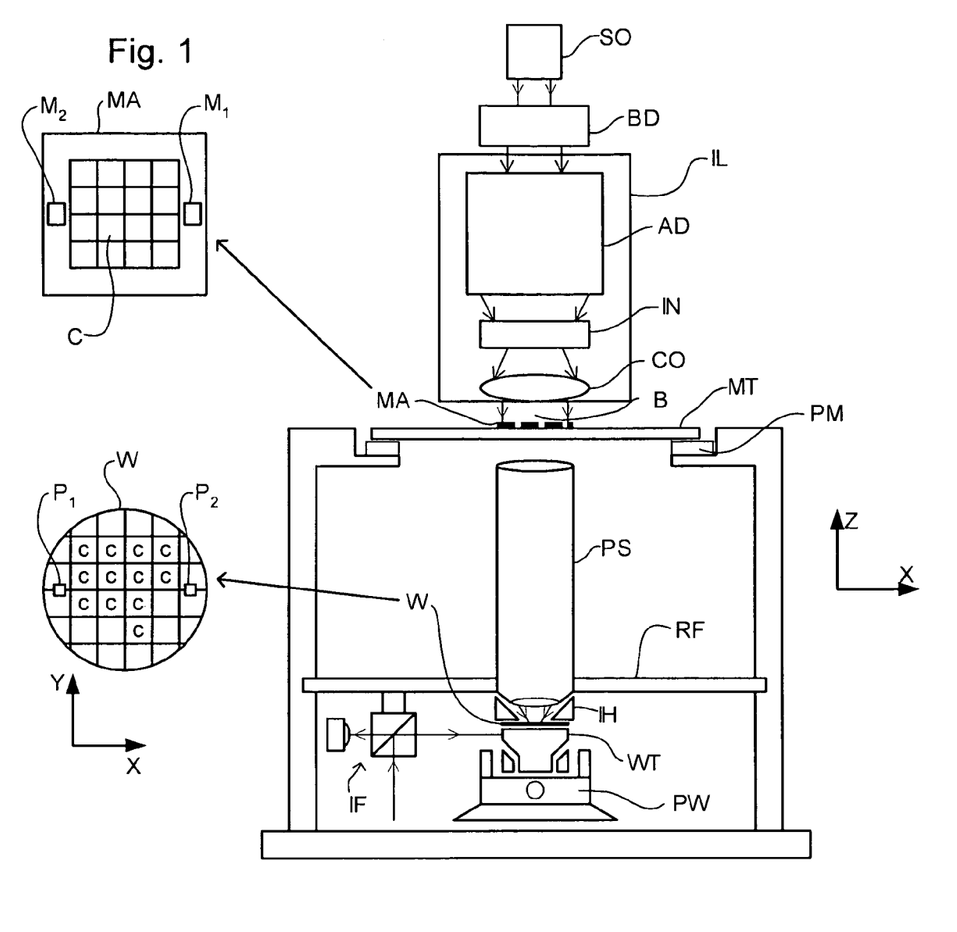
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or DUV radiation), a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W. The apparatus also includes a reference frame RF.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as cy-outer and cy-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

FIG. 5 illustrates a liquid supply system which may be used in an embodiment of the present invention. However, embodiments of the present invention are applicable to all types of liquid supply system and for instance those which supply liquid to a localized area of the substrate such as those of FIGS. 2 to 4. However, embodiments of the invention are equally applicable to other types of liquid supply system in for instance those which provide immersion liquid to a localized area of top surface of the substrate table.

In the liquid supply system illustrated in FIG. 5, a seal is created between a barrier member 12 and the top surface of the substrate W to contain immersion liquid in a space 11 between the projection system PS and the substrate W. In this liquid supply system a flow of gas 16 is effective to create this seal. Other systems can be used to create the seal. For instance, going radially outwardly from the inner most edge of the bottom surface of the barrier member 12, a seal can be made up of a single phase liquid extractor, a recess for creating a vortex of gas and a gas knife. This combination can be effective in providing an effective seal.

However, with these types of liquid supply system, when the substrate W is taken away from under the projection system PS, such as during substrate swap, immersion liquid can run out of the space 11 because part of the space 11 is formed by the top surface of the substrate table or other object placed on the substrate table WT. This can result in drying stains appearing on the final element of the projection system PS which has a deleterious effect on the imaging quality of that final element.

One way to overcome this is to place a shutter member or similar surface under the projection system PS to take the place of the substrate W during substrate swap. Thus, the shutter member can be considered to be a dummy substrate. In this way the seal formed between the barrier member 12 and the substrate W can be maintained in the activated condition when the shutter member is in position under the projection system PS so that a seal is formed between the barrier member 12 and the shutter member such that the final element of the projection system PS is kept wet even during substrate swap.

Previously, the idea of having a shutter member placed on a substrate table WT has been put forward. In this scenario the shutter member is of a smaller size that the substrate W but large enough to extend over the whole inner gap in the barrier member 12 through which the projection beam B passes. Thus, a seal can be formed between the barrier member 12 and the shutter member. Such a shutter member is used in the following way: after imaging of the substrate W the substrate table WT is moved such that the shutter member (which is on the substrate table) is positioned under the projection system PS. The shutter member is then attached to the liquid supply system and this seals the liquid in the space 11. The substrate table WT can then be moved away and the next substrate table moved under the projection system. The shutter member is placed on the substrate table WT and the substrate table then moved such that the new substrate W is under the projection system PS. In this system, as with that of an embodiment of the present invention, the same seal can be used between the liquid supply system and the shutter member as between the liquid supply system and the substrate, but this is not necessarily the case, and a physical type seal (contact) could also be used.

With the above system, the process is quite time consuming and therefore deleteriously affects throughput. Also errors in the positioning of the shutter member add up over time such that the position of the shutter member may not be reliably tracked.

Figure 6:
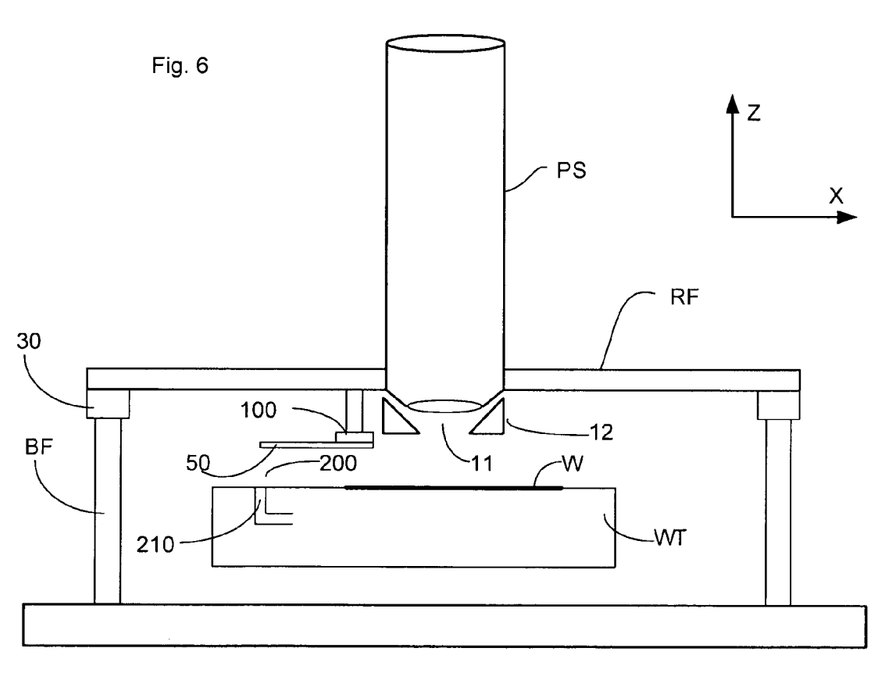
FIG. 6 depicts, in cross-section, an apparatus in accordance with an embodiment of the present invention.

FIG. 6 shows an embodiment of the present invention. A lithographic apparatus is supported on the ground by a base frame BF. A metrology or reference frame RF is attached to the base frame BF and isolated from vibrations of the base frame BF by mechanical isolators 30 such as dampers. Thus, the metrology frame RF is dynamically isolated from the base frame BF. The substrate table WT which supports a substrate W is supported by the base frame BF. The projection system PS through which the beam of radiation B passes is supported by the metrology frame RF. A liquid supply system including a barrier member 12 can either be supported on the substrate W or may also be supported on the metrology frame RF. The liquid supply system can be translatable in the xy plane which is a plane perpendicular to the optical axis of the apparatus. Furthermore, the substrate table may be actuatable in the z direction.

In the embodiment of FIG. 6, a shutter member 50 is illustrated. The shutter member 50 is separate from the substrate table WT (of which there are preferably at least two) driven by an actuator 100 so that the shutter member 50 can be positioned under the projection system PS thereby to block the space 11 in the same way as a dummy substrate. Alternatively, the shutter member 50 can be inserted into the liquid supply system as described below with reference to FIG. 12. In this way, when the substrate W is moved from under the projection system PS, immersion liquid remains in contact with the final element of the projection system PS thereby avoiding drying stains on the final element.

The shutter member maybe controlled in a wireless way.

Thus, the shutter member 50 is actively controlled by actuator 100. The actuator 100 is connected between the metrology frame RF and the shutter member 50 such that the position of the shutter member 50 relative to the projection system PS is always accurately known and errors cannot be introduced by picking up and dropping of the shutter member 50. The actuator 100 never releases the shutter member 50. The shutter member of this or any other embodiment may be connected to the base frame BF rather than to the metrology frame RF.

Figure 7:
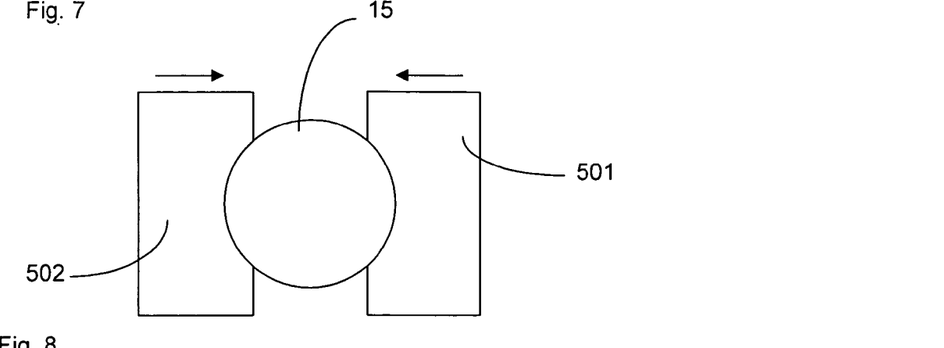
FIG. 7 illustrates, in plan, a shutter in accordance with an embodiment of the present invention.
Figure 8:
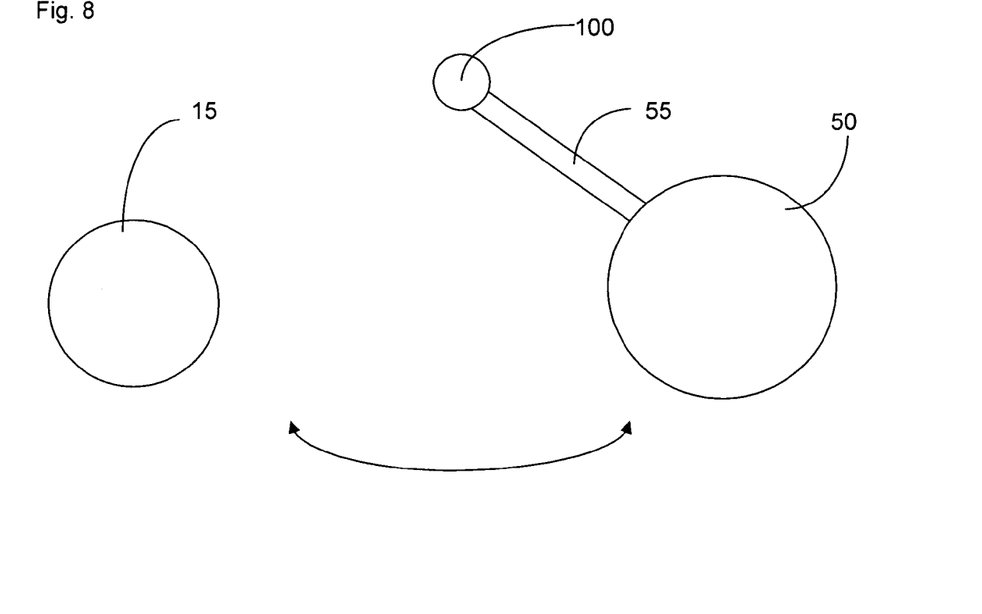
FIG. 8 illustrates, in plan, the actuation mechanism of a shutter member which is in accordance with an embodiment of the present invention.
Figure 9:
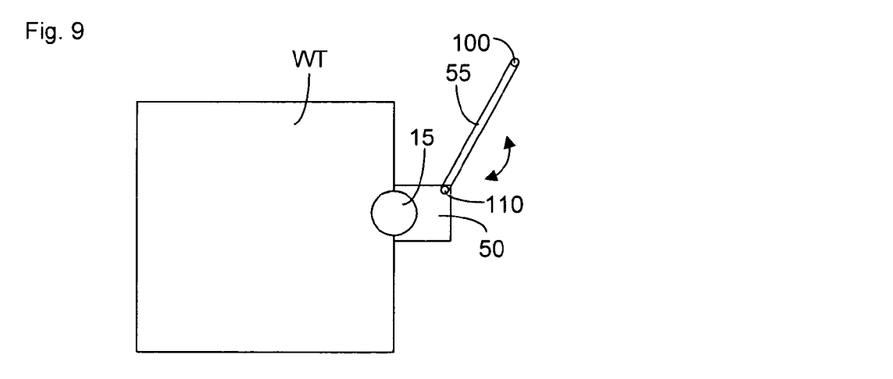
FIG. 9 illustrates, in plan, another shutter member and substrate table in accordance with an embodiment of the present invention.

As illustrated in FIG. 6 the shutter member 50 is comprised of a single element. However, this is not necessarily the case and, as illustrated in FIG. 7, the shutter member could be made up of more than one element, for instance two elements as is described below. The actuator 100 can translate and/or rotate the shutter member 50 and two examples of a combination of rotation and translation are illustrated in FIGS. 8 and 9.

In order to position the shutter member 50 under the projection system PS and thereby prevent leaking of immersion liquid from the space 11 the shutter member 50 can be inserted into position while the substrate W or substrate table WT or object mounted on the substrate table WT is still positioned under the projection system. This may be accomplished with or without actuation of the liquid supply system towards the projection system (i.e. in the z axis away from the substrate substantially in the direction of the optical axis). In the instance where the shutter member 50 is placed under the projection system PS before the substrate W has been moved away, it is beneficial to place the substrate table WT such that a drain area 200 is positioned under the projection system PS. This is because, when the shutter member 50 is inserted between the liquid supply system and the substrate table WT, liquid can remain between the shutter member 50 and the substrate table WT. The drain area 200 is provided with an outlet 210 connected to a low pressure source such that any such remaining liquid can be removed. The drain area is large enough to be able to enclose the whole footprint of the space 11. A similar drain area can be used with the embodiment illustrated in FIG. 12 in which the shutter member 50 is inserted between the projection system PS and the bottom of the liquid supply system which usually forms a seal with the substrate W (i.e. it is not positioned under the liquid supply system such that no seal between it and the liquid supply system is formed by the seal which normally forms a seal with the substrate W). A further method of removing such remaining liquid in that embodiment is described in relation to FIG. 12 below.

An alternative system involves moving of the substrate table WT out from under of the projection system while the shutter member 50 is moved to a position under the projection system PS; a trailing edge (i.e. one which is the last to pass under the projection system PS) of the substrate table WT is closely followed by a leading edge (i.e. on which is first to pass under the projection system) of the shutter member 50 such that preferably as small a gap as possible is left between the substrate table WT and the shutter member 50. This allows a seamless transition from sealing of the barrier member 12 between the substrate W and the shutter member 50 without deactivating the liquid supply system. An embodiment of how this can be achieved is illustrated in FIG. 9. This transition without varying the conditions under which the liquid supply system is run is most easily accomplished if the top surface of the edge of the substrate table WT and the shutter member 50 are co-planar. This series of events may or may not be accompanied by movement in the z direction of the shutter member 50 in order that the top surface of the shutter member 50 can be positioned in the same plane as the top surface of the substrate W and the top surface of the substrate table WT. This embodiment is similar to the embodiment illustrated in FIGS. 10 and 11.

The shutter member 50 may be comprised of any material, e.g. stainless steel. Also, it is possible that the top surface of the shutter member 50 is coated with a material which is at least partly liquid or hydrophobic to the immersion liquid. One such material might be polytetrafluoroethylene (PTFE). For example, immersion liquid could have a contact angle of greater than 45°, greater than 70°, greater than 90°, 100°, 110°, 120°.

Movement of the shutter member 50 is under the control of a controller which synchronizes the movement of the substrate table and the shutter member according to the above described method.

In one embodiment the actuator 100 is not present and the substrate table WT has a mechanism configured to draw the shutter member 50 under the projection system PS as the substrate table WT moves away from under the projection system PS. The next substrate table to arrive then pushes the shutter member 50 away. A suitable mechanism could be magnetic to allow selectable attachment of the shutter member to the substrate table WT or a vacuum attraction device. In this instance the shutter member 50 is simply mechanically attached to the metrology frame RF.

FIG. 7 illustrates, in plan, an embodiment of the present invention. The shaded circular area labelled 15 represents the footprint of the space 11 and can be considered to be the area covered in immersion liquid at any one time.

In the embodiment illustrated in FIG. 7 the shutter member is comprised of two leafs 501, 502. Each of these leafs is actuated by an actuator (not illustrated) and connected to the metrology frame RF through that actuator. The leafs 501, 502 are positioned in a retracted state or configuration on either side of the liquid supply system 10 (not shown in FIG. 7) when not in use. When they are activated, the liquid supply system can optionally be moved upwards towards the projection system to allow more space between the liquid supply system and the substrate W and the leafs 501, 502 are brought inwards and meet at their inner most edges thereby to seal the space. In this embodiment, it is possible that the leafs pass through the barrier member 12 of a liquid supply system according to FIG. 5 or they could be positioned inside the barrier member 12. In that case a small amount of water remains on the substrate table WT after closing of the leafs 501, 502 and a method of removing that remaining water is described in relation to FIG. 12. Also the drain area 200 illustrated in FIG. 6 may be used to remove that water.

In this embodiment as in all others, the shutter member may be cleaned and/or dried at a cleaning/drying station following removal from under the projection system to avoid drying stains which can lead to contamination.

FIG. 8 illustrates an embodiment which is the same as the embodiment shown in FIG. 6 except as described below. In the embodiment of FIG. 8, the actuator 100 is effective to rotate a lever arm 55 to which the shutter member 50 is attached. Rotation of the lever arm 55 around a point which is distal to the attachment point with the shutter member 50 is effective to rotate and translate the shutter member 50 from a position (illustrated) at which it is not positioned under the projection system PS to a position at which it is positioned under the projection system PS.

The embodiment illustrated in FIG. 9 is similar to that of the embodiment illustrated in FIG. 6 except as described below. In the embodiment illustrated in FIG. 9 the shutter member 50 and actuation mechanism is designed for being moved simultaneously with the substrate table WT under the projection system PS. Thus, two actuators 100, 110 are provided one 100 to rotate the lever arm 55 and another, 110, to rotate the shutter member 50 relative to the lever arm 55 such that a leading edge 51 of the shutter member 50 can be abutted or brought to close proximity to a trailing edge 40 of the substrate table WT as the substrate table WT is moved from under the projection system PS and the shutter member 50 is simultaneously moved to take its place. In an alternative embodiment the second actuator 110 can be omitted, the rotation of the shutter member 50 around point 110 being accomplished by interaction with the leaving substrate table WT.

Figure 10:
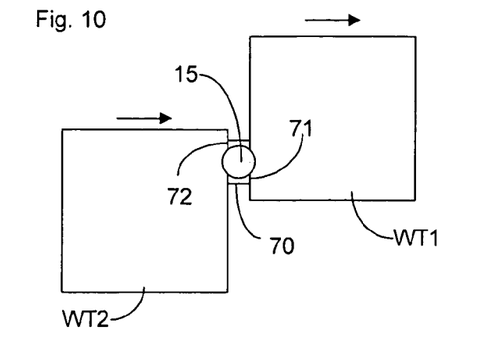
FIG. 10 illustrates, in plan, the use of another different shutter member in accordance with an embodiment of the present invention.

Another embodiment is illustrated in FIG. 10. In this embodiment the shutter member 70, contrary to the other embodiments, is not large enough to completely cover the footprint 15 of the space 11 by itself. The shutter member 70 is long enough so that it is longer than the footprint 15 in (at least) one dimension and it is also attached to and actuated from the metrology frame RF.

A trailing edge 72 of a first substrate table WT1 immediately precedes a leading edge 71 of the shutter member 70. The trailing edge of the shutter member 70 immediately precedes the leading edge of a second substrate table WT2. Thus, transfer of one substrate W1 (not shown in FIG. 10) for another substrate W2 (not shown in FIG. 10) under the projection system PS is effected by moving a first substrate table WT1 out from under the projection system PS and replacing it with the shutter member 70. As the shutter member 70 moves under the projection system a second substrate table WT2 follows it. Thus, the footprint 15 at one time covers parts of the first and second substrate tables as well as the shutter member 70. However, the shutter member 70 could be large enough such that this never occurs and the footprint either covers the substrate table WT1 or the substrate table WT2 alone or covers both the shutter member 70 and the first substrate table WT1 or the shutter member 70 and the second substrate table WT2. The benefit of this embodiment is that the first and second substrate tables WT1, WT2 never need to be positioned particularly close to each other such that crashing of one substrate table into the other is less likely. A similar sequence of events is possible even if the shutter member 70 is large enough to cover the footprint 15.

In the embodiment of FIG. 10, the lithographic apparatus includes a controller that is configured to control swapping of the substrate held by the first substrate table WT1 for another substrate held by the second substrate table WT2 under the projection system substantially without losing liquid from the liquid supply system by moving the first and second substrate tables together under the liquid supply system with the intermediate shutter member being positioned between the first and second substrate tables.

Figure 11:
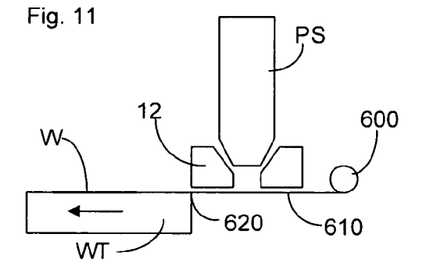
FIG. 11 illustrates, in cross-section, another shutter member in accordance with an embodiment of the present invention.

A lithographic apparatus in accordance with another embodiment is illustrated in FIG. 11. The embodiment of FIG. 11 is the same as the embodiment of FIG. 6 except as described below. In the embodiment of FIG. 6, the shutter member 50 is comprised of a relatively stiff plate. In the embodiment of FIG. 11, in contrast, the shutter member 50 is provided by a member which, in a retracted state or configuration, is rolled up upon itself (and optionally around a roller) and which extends to an extended position (as illustrated) by unwinding. This embodiment can either be used such that a leading edge of the shutter member follows a trailing edge of a substrate table WT moving out from under the projection system PS or can be used in the embodiment where the substrate table WT remains under the projection system PS while the shutter member is itself positioned under the projection system PS. As with the embodiment of FIG. 6 the shutter member is attached to the metrology frame RF. However, the system can be actuated by the substrate table itself as described below or may be actuated in a more similar way to the first embodiment by an actuator which is connected to the metrology frame RF.

The shutter member of the embodiment of FIG. 11 is rolled around a roll 600 in a retracted position in which position it is not positioned under the projection system PS. The shutter member includes a foil 610 which, when unwound from the roll 600, is extendable underneath the projection system PS. This is achieved by pulling a leading edge 620 of the foil from off the roll so that the remaining foil unwinds from the roll 600. The top surface of the unwound foil 610 then provides the surface against which the seal of the barrier member 12 seals. The foil 610 can then be attached or attracted onto the underside of the barrier member 12 using an under pressure source on the bottom surface of the barrier member 12 or by another system, such as magnetic forces.

As previously mentioned, the foil 610 can be unrolled from the roll 600 by an actuator attached to the metrology frame. Alternatively the leading edge 620 of the foil 610 may be attached to a substrate table WT (for example at a trailing edge through a magnetic coupler). Once the next substrate is in position or as the next substrate table arrives the foil 610 can be retracted either through its own actuator or by being pushed by the newly arrived substrate table WT.

The foil 610 may be made of stainless steel, perhaps coated for improved cleaning and/or drying of the shutter member.

Figure 12:
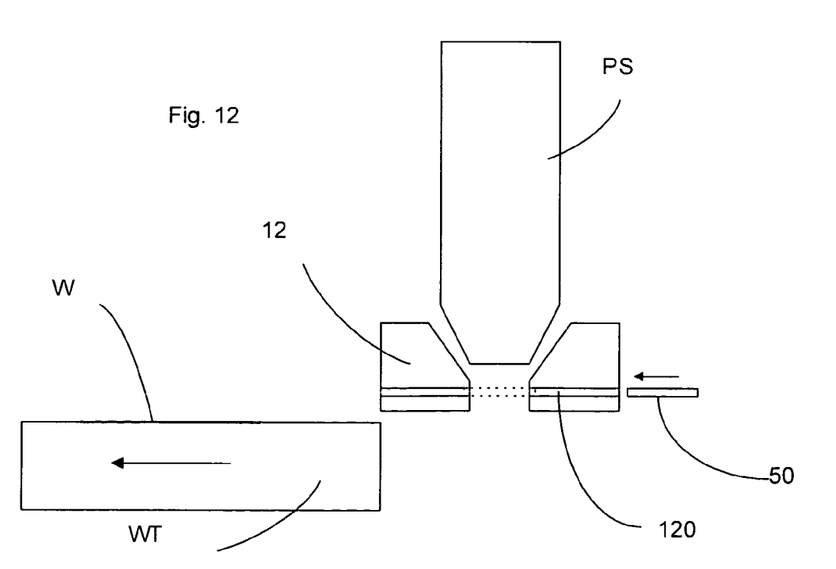
FIG. 12 illustrates yet another arrangement in accordance with an embodiment of the present invention.

FIG. 12 shows a feature which could be applied to all other embodiments. In the embodiment illustrated in FIG. 12 the shutter member or members are not positioned under the liquid supply system between the liquid supply system and the substrate W but are positioned in the liquid supply system. This can work with barrier type liquid supply systems such as those illustrated in FIG. 4 or 5. The shutter members may be part of the liquid supply system may be driven by actuators attached to the metrology frame RF or projection system PS.

Thus, the barrier member 12 has a passage 120 through it to enable a shutter member 50 to be inserted in the passage such that the shutter member divides the space 11 illustrated in FIG. 5 into two, one area above the shutter member 50 and below the projection system PS and a second area below the shutter member 50 and above the bottom surface of the barrier member 12. In some cases the shutter member 50 (which may be formed by more than one element) can remain inside of the barrier member 12 in a retracted position whereas in other embodiments, such as that illustrated in FIG. 12, the shutter member 50 is outside of the barrier member 12 when in the retracted position.

Particularly in this embodiment, the shutter member may be made up of more than one element.

In this embodiment some liquid will remain under the shutter member 50 between the shutter member 50 and the substrate W. This remaining liquid will need to be removed. One method of removing this liquid has been described above in relation to the embodiment illustrated in FIG. 6 by the provision of a drain area 200 on the substrate table WT. In the embodiment of FIG. 12 where the shutter member 50 is actually provided in the barrier member 12 it is possible to provide a liquid removal device on the barrier member 12 (which may or may not be part of the normal seal system to form a seal between the barrier member 12 and the substrate W) for removing the remaining liquid. Use of this seal to remove the remaining water may require the substrate table WT to be moved around under the projection system PS such that all areas which are covered by the remaining water are brought under the extractor 14 (see FIG. 5) of the seal system. It may be desirable, in order to avoid a vacuum being generated to open the space surrounded by the barrier member 12 and the shutter member 50 to the atmosphere to avoid liquid being retained in that space. Additionally, it may be desirable to provide a gas stream to that area to blow free any liquid droplets attached to the underside of the plate 50 or to the inner side walls of the barrier member 12 which define the space.

Figure 13:
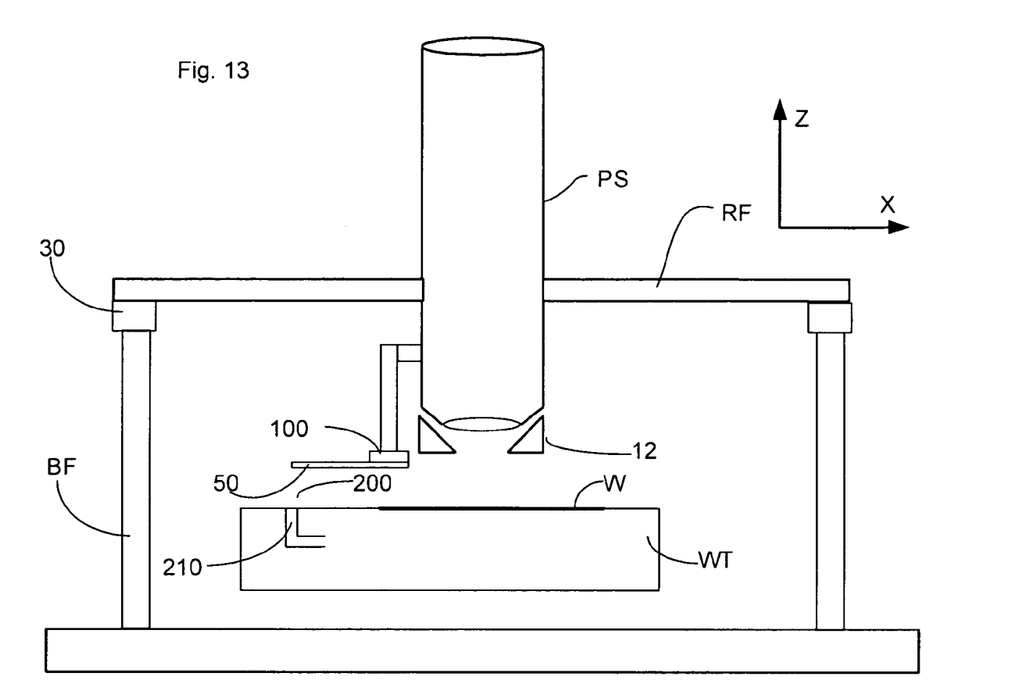
FIG. 13 illustrates, in cross-section, an apparatus in accordance with an embodiment of the present invention.

FIG. 13 illustrates a lithographic apparatus in accordance with an embodiment which is the same as the embodiment of FIG. 6 except that the actuator 100 is attached between the projection system and the shutter member 50 such that the actuator is attached to the metrology frame RF through the projection system.

Figure 14:
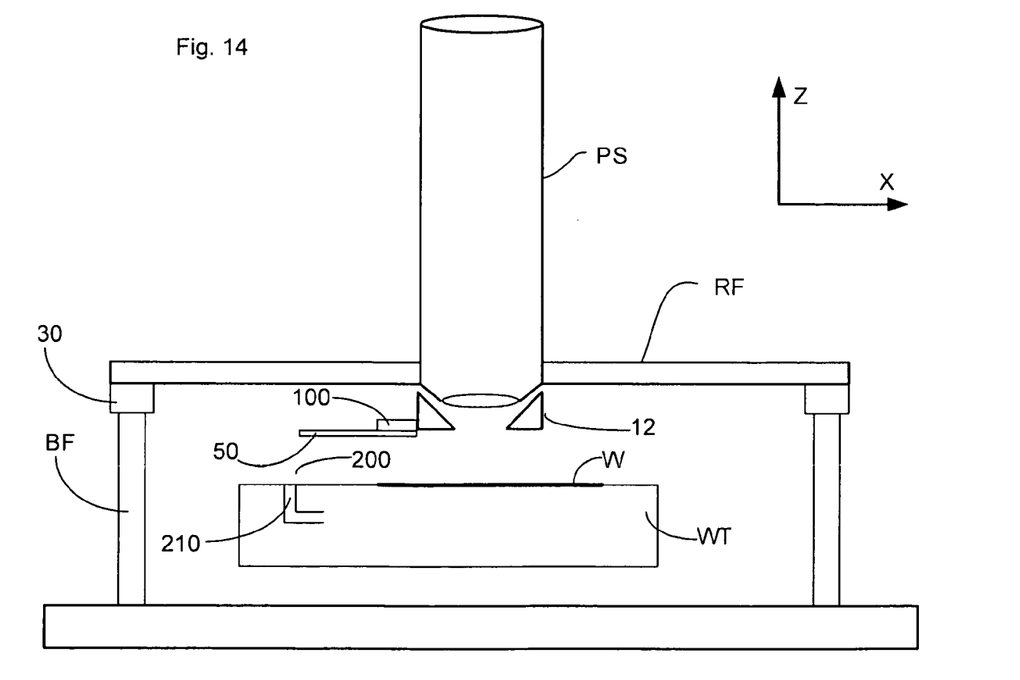
FIG. 14 illustrates, in cross-section, an apparatus in accordance with an embodiment of the present invention.

FIG. 14 shows an apparatus in accordance with an embodiment which is the same as the embodiment of FIG. 6 except that the actuator 100 is attached to the liquid supply system (which is itself moveably attached to the metrology frame). This is particularly relevant to the barrier member 12 type liquid supply system such as the one of FIG. 4 or 5. As illustrated, the shutter member does not pass through the barrier member 12, but it may do so.

Any features of any of the above embodiments may be combined or added to any of the above described embodiments.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The present invention can be applied to any immersion lithography apparatus, in particular, but not exclusively, those types mentioned above.

The descriptions above are intended to be illustrative, not limiting. Thus, it will be apparent to one skilled in the art that modifications may be made to the invention as described without departing from the scope of the claims set out below.

What is claimed is:

1. A lithographic projection apparatus, comprising:
    a substrate table configured to support a substrate;
    a projection system configured to project a pattern from a patterning device onto a substrate,
    a liquid supply system configured to supply liquid in a space between an element of the projection system and the substrate;
    a metrology frame configured to support the projection system and attached to, and dynamically isolated from, a base frame that supports the apparatus;
    a shutter member positionable substantially to ensure that the liquid remains in contact with the element when the substrate is moved away from under the projection system; and
    an actuator configured to position the shutter member, wherein, in use, the actuator is connected to the metrology frame and the shutter member during projection of the pattern through the liquid onto the substrate, wherein the liquid supply system includes a seal member that is configured to confine liquid between the element and the substrate during the projection of the pattern through the liquid onto the substrate, and wherein the shutter member is positionable under the seal member to keep the liquid in contact with the element of the projection system without moving the substrate table.

2. The lithographic projection apparatus according to claim 1, wherein the actuator is connected directly to the metrology frame and the shutter member.

3. The lithographic projection apparatus according to claim 1, wherein the actuator is configured to position the shutter member by rotation, translation, or both rotation and translation.

4. The lithographic projection apparatus according to claim 1, wherein the shutter member includes two or more parts which are positionable next to each other under the liquid supply system to ensure that the liquid remains in contact with the element when the substrate is moved away from under the projection system.

5. The lithographic projection apparatus according to claim 1, wherein a surface of the shutter member, which faces the projection system when the shutter member is positioned under the liquid supply system, is configured to define a contact angle of more than about 45° with the liquid.

6. The lithographic projection apparatus according to claim 1, wherein the shutter member is, on its surface facing the projection system when it is positioned under the liquid supply system, coated with polytetrafluoroethylene (PTFE).

7. The lithographic projection apparatus according to claim 1, wherein the shutter member includes stainless steel.

8. The lithographic projection apparatus according to claim 1, wherein the substrate table is adapted to remain under the projection system when the shutter member is positioned under the projection system to keep the liquid in contact with the element of the projection system.

9. A lithographic projection apparatus comprising:
    a projection system configured to project a pattern from a patterning device onto a substrate;
    a liquid supply system configured to supply liquid to a space between an element of the projection system and a substrate;
    a shutter member positionable substantially to ensure that liquid remains in contact with the element when the substrate is moved away from under the projection system; and
    a substrate table configured to support the substrate and comprising a drain area movable to a position under the liquid supply system and at which position liquid under the shutter member is removable,
    wherein the shutter member and the drain area are spaced apart from each other during projection of the pattern through the liquid onto the substrate, wherein the liquid supply system includes a seal member that is configured to confine liquid between the element and the substrate during the projection of the pattern through the liquid onto the substrate, and wherein the shutter member is positionable under the seal member to keep the liquid in contact with the element of the projection system without moving the substrate table.

10. The lithographic projection apparatus according to claim 9, wherein the drain area comprises an outlet attached to a low pressure source configured to remove liquid.

11. The lithographic projection apparatus according to claim 9, wherein the drain area comprises a surface substantially in the same plane as a top surface of the substrate which is, in plan, of a size at least as large as the space.

12. The lithographic projection apparatus according to claim 9, wherein the substrate table is adapted to remain under the projection system when the shutter member is positioned under the projection system to keep the liquid in contact with the element of the projection system.

13. A device manufacturing method comprising:
    projecting a patterned beam of radiation with a projection system onto a substrate, the substrate supported by a substrate table;
    supplying liquid to a space between an element of the projection system and the substrate with a liquid supply system, the liquid supply system including a seal member that is configured to confine liquid between the element and the substrate during the projection of the pattern beam of radiation through the liquid onto the substrate;

subsequent to the projecting, inserting a shutter member under the seal member before moving the substrate table relative to the projection system such that liquid remains in contact with the element of the projection system when the substrate is removed;

maintaining the substrate table under the projection system when the shutter member is positioned under the projection system to keep the liquid in contact with the element of the projection system; and removing liquid remaining under the shutter member with a liquid removal device of the liquid supply system.

14. The method of claim 13, further comprising sealing a space between a barrier member of the liquid supply system and the substrate during the projecting using the liquid removal device.

15. A device manufacturing method comprising:

projecting a patterned beam of radiation onto a substrate on a substrate table with a projection system;

supplying liquid to a space between an element of the projection system and the substrate with a liquid supply system, the liquid supply system including a seal member that is configured to confine liquid between the element and the substrate during the projection of the pattern beam of radiation through the liquid onto the substrate;

subsequent to the projecting, inserting a shutter member under the seal member before moving the substrate table relative to the projection system such that the liquid remains in contact with the element of the projection system when the substrate is removed;

maintaining the substrate table under the projection system when the shutter member is positioned under the projection system to keep the liquid in contact with the element of the projection system; and removing any liquid remaining under the shutter member using a drain area arranged on the substrate table and positioned under the liquid supply system.

* * * * *